US008258695B2

(12) United States Patent
Yanashima et al.

(10) Patent No.: US 8,258,695 B2
(45) Date of Patent: Sep. 4, 2012

(54) CAPSULAR MICRO LIGHT-EMITTING DEVICE AND METHOD FOR MANUFACTURING THE SAME

(75) Inventors: Hiroyuki Yanashima, Ibaraki (JP); Shinichi Morishima, Ibaraki (JP); Kyoko Yamamoto, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 228 days.

(21) Appl. No.: 12/303,565

(22) PCT Filed: Jun. 15, 2007

(86) PCT No.: PCT/JP2007/062558
§ 371 (c)(1),
(2), (4) Date: Dec. 5, 2008

(87) PCT Pub. No.: WO2007/148771
PCT Pub. Date: Dec. 27, 2007

(65) Prior Publication Data
US 2010/0171133 A1    Jul. 8, 2010

(30) Foreign Application Priority Data
Jun. 19, 2006    (JP) .................................. 2006-168585

(51) Int. Cl.
*H01L 51/50*    (2006.01)
(52) U.S. Cl. ....................................................... 313/512
(58) Field of Classification Search .................. 313/504, 313/512
See application file for complete search history.

(56) References Cited

U.S. PATENT DOCUMENTS

| 6,538,375 | B1 | 3/2003 | Duggal et al. |
| 7,255,823 | B1 | 8/2007 | Guenther et al. |
| 2002/0139981 | A1 | 10/2002 | Young |
| 2004/0047151 | A1 | 3/2004 | Bogner et al. |
| 2005/0088087 | A1* | 4/2005 | Ogawa ........................ 313/511 |

FOREIGN PATENT DOCUMENTS

| JP | 6-251876 A | 9/1994 |
| JP | 10064678 A | 3/1998 |
| JP | 11-265785 A | 9/1999 |
| JP | 2001-307870 A | 11/2001 |
| JP | 2002352949 A | 6/2002 |
| JP | 2005-108643 A | 4/2005 |
| JP | 2005099410 A | 4/2005 |
| JP | 2006-12760 A | 1/2006 |
| JP | 2006-23464 A | 1/2006 |
| JP | 2007-59098 A | 3/2007 |
| WO | 0051192 A1 | 8/2000 |
| WO | 2007148769 A1 | 12/2007 |

OTHER PUBLICATIONS

Japanese Office Action dated Sep. 29, 2011 issued in corresponding Japanese Patent Application No. 2006-168585.
Japanese Patent Office, "Decision of Rejection," issued in connection with Japanese Patent Application No. 2006-168585, dated Apr. 3, 2012.

* cited by examiner

*Primary Examiner* — Anh Mai
*Assistant Examiner* — Hana Featherly
(74) *Attorney, Agent, or Firm* — Sughrue Mion, PLLC

(57) ABSTRACT

A capsular micro light-emitting device, including: a light emitting part having at least a light emitting layer and constituting one pixel; a capsular encapsulation layer for individually encapsulating the light emitting part; and first and second electrodes for applying a voltage to the light emitting part.

11 Claims, 3 Drawing Sheets

CAPSULAR MICRO LIGHT-EMITTING DEVICE AND METHOD FOR MANUFACTURING THE SAME

TECHNICAL FIELD

The present invention relates to a capsular micro light-emitting device and a method for manufacturing the same.

BACKGROUND ART

As a light emitting device, there have been conventionally known an organic EL device which emits light by causing a current to flow to a light emitting layer thereof, an inorganic EL device which emits light by applying a voltage to the light emitting layer thereof, and the like. These light emitting devices are applied to backlights of a liquid crystal display, a display, and the like. As the light emitting device, for example, there is disclosed in JP-A-10-64678 a linear light emitting device 1 obtained by laminating at least one layer of an organic light emitting layer containing an organic compound having a carrier transport property and a transparent electrode layer in this order on at least a part of the outer periphery of a linear conductor. There is disclosed in JP-T-2002-538502 a light emitting device 2 in which a plurality of light emitting devices each having two electrodes are included on a fiber and each of the light emitting devices emits light by supplying an electric signal between the two electrodes. There is disclosed in JP-A-2002-352949 a linear light emitting device 3 obtained by laminating an electrode layer, at least one layer of an organic light emitting layer containing an organic compound having a carrier transport property, and a transparent electrode layer in this order on at least a part of the outer periphery of an organic fiber. There is disclosed in JP-A-2002-184580 a fibrous light emitting device 4 including a fiber core having a first electrode on the outside, at least one light emitting layer placed on the outer surface of the first electrode, and a transparent second electrode placed the light emitting layer. These linear light emitting devices 1 to 4 can be utilized as a sheet-like light emitting apparatus by placing a plurality of the linear light emitting devices 1 to 4 on a substrate. In addition, there are disclosed in JP-T-2002-503832 a tiled display and a tile (a light emitting device 5) formed of a plurality of pixel forming devices used for the tiled display.

However, when the sheet-like light emitting apparatus is manufactured by using any of the linear light emitting devices 1 to 4, the obtained sheet-like light emitting apparatus has not been sufficient in terms of flexibility. Furthermore, when the sheet-like light emitting apparatus is manufactured by using an organic EL material, it is highly important to block the light emitting layer from oxygen and moisture in terms of obtaining a longer lifetime for the light emitting apparatus. However, since there has been conventionally adopted a method which integrally encapsulates an entire light emitting surface, it has been necessary to use a film having sufficient flexibility and an extremely high gas-barrier property for the encapsulation in order to obtain a practical and flexible sheet-like light emitting apparatus. However, there has not been a film for the encapsulation having sufficient characteristics in the gas-barrier property and flexibility under the present situation. Further, even when the sheet-like light emitting apparatus is manufactured by using the linear light emitting device 5, the sheet-like light emitting apparatus has not been sufficient in flexibility since the tiles each formed of a plurality of pixel forming devices are integrally encapsulated.

DISCLOSURE OF THE INVENTION

An object of the present invention is to provide a capsular micro light-emitting device which allows the obtention of a sheet-like light emitting apparatus which has highly excellent flexibility, does not require an extremely high gas-barrier property among characteristics of a film or the like to be used for encapsulation, and is capable of individually repairing a faulty pixel with ease at the time of occurrence of faults, and a method for effectively manufacturing the capsular micro light-emitting device.

The present inventors have achieved the present invention as a result of a dedicated study for attaining the foregoing object.

That is, the present invention provides a capsular micro light-emitting device including a light emitting part having at least a light emitting layer and constituting one pixel, a capsular encapsulation layer for individually encapsulating the light emitting part, and first and second electrodes for applying a voltage to the light emitting part.

In the capsular micro light-emitting device according to the present invention, the light emitting layer emits light by applying a voltage to the light emitting part via the first and second electrodes. When a plurality of the capsular micro light-emitting devices are placed on a prescribed substrate, higher brightness of the light emitting apparatus and an improvement in the evenness of the brightness can be achieved since a sheet-like light emitting apparatus in which a light-emitting function is exerted in each pixel can be obtained. The sheet-like light emitting apparatus is constructed of a capsular light emitting device where one pixel is already encapsulated. Since the light emitting device constituting the pixel is individually encapsulated, a film having the extremely high gas-barrier property, which has been conventionally required when a light emitting apparatus having a plurality of light-emitting portions placed on a substrate is integrally encapsulated, is not necessarily required. In addition, when a fault occurs in a part of the sheet-like light emitting apparatus, a repair can be easily made by replacing the capsular micro light-emitting device of a faulty pixel with a new capsular micro light-emitting device.

In the sheet-like light emitting apparatus where a plurality of the capsular micro light-emitting devices are placed, since the size of each of the capsular micro light-emitting devices is small, and is present on the surface of the sheet in a dot-like pattern, even when the sheet-like light emitting apparatus is bent, the force received by each the light emitting device is small and the light emitting apparatus is hardly influenced by the difference between the bending properties of the light emitting device and the substrate. As a result, the sheet-like light emitting apparatus can be sufficiently bent. By appropriately changing the substrate to be used or the like, the sheet-like luminous can be flexible enough to have even stretchability. In accordance with the capsular micro light-emitting device, highly excellent flexibility can be added to the sheet-like light emitting apparatus using the capsular micro light-emitting device.

The capsular micro light-emitting device has an average diameter of 1 to 1000 μm, more preferably 1 to 500 μm, a length of 1 to 2000 μm, more preferably 1 to 500 μm, and preferably has a cylindrical capsular configuration with a ratio between the average diameter and the length (average diameter:length) of 1:1 to 1:5. When the average diameter and the length are less than respective lower limits, the workability at the time of the manufacture is lowered. On the other hand, when the average diameter and the length exceeds respective upper limits described above, variations in the flow of a current and the application of a voltage become large, and the heat generation from the device itself becomes large, and further the size of the device itself becomes too large so that the flexibility of the light emitting apparatus is lowered when the light emitting apparatus is manufactured with the device placed thereon.

In the capsular micro light-emitting device, it is preferable that the light emitting layer is a tubular light emitting layer, the first electrode is placed in an inner periphery of the tubular light emitting layer, and the second electrode is placed on an outer periphery of the tubular light emitting layer.

In the capsular micro light-emitting device, it is preferable that the light emitting layer comprises an organic EL material or an inorganic EL material, and is especially preferable that the light emitting layer comprises the organic EL material. The use of the organic EL material and the inorganic EL material allows more effective light emission. When the light emitting layer comprises the preferred organic EL material, in the capsular micro light-emitting device, it is preferable that one of the first and second electrodes is a cathode, and the light emitting part further includes an electron transport layer and/or an electron injection layer placed between the cathode and the light emitting layer. In addition, in the capsular micro light-emitting device, it is preferable that one of the first and second electrodes is an anode, and the light emitting part includes a hole transport layer and/or a hole injection layer placed between the anode and the light emitting layer. By including the electron transport layer, the electron injection layer, the hole transport layer, or the hole injection layer, it becomes possible to cause the capsular micro light-emitting device to emit light more effectively.

The present invention also provides a method for manufacturing a capsular micro light-emitting device including the steps of, coating a light emitting layer material onto an outer periphery of a linear first electrode material and drying the light emitting layer material to form a tubular light emitting layer, forming a tubular second electrode by supplying a second electrode material onto the outer periphery of the tubular light emitting layer to obtain a tubular multilayer body, applying a laser beam onto the outer periphery of the tubular multilayer body for irradiation at prescribed intervals to form exposed portions where the first electrode material is exposed at prescribed intervals, coating an encapsulant onto the outer periphery of the tubular multilayer body formed with the exposed portions and drying the encapsulant to form an encapsulation layer, and cutting the tubular multilayer body formed with the encapsulation layer at the exposed portions to obtain the capsular micro light-emitting device including a light emitting part having at least a light emitting layer and constituting one pixel, a capsular encapsulation layer for individually encapsulating the light emitting part, and first and second electrodes for applying a voltage to the light emitting part.

In the method for manufacturing the capsular micro light-emitting device, since the exposed portions described above are formed by applying the laser beam to the tubular multi-layer body for irradiation at prescribed intervals, the capsular micro light-emitting device can be effectively manufactured. The design of size of the capsular micro light-emitting device can also be easily changed by changing the interval of the irradiation of the laser beam. In addition, in the method for manufacturing the capsular micro light-emitting device, since the individual steps can be successively performed in one continuous manufacturing line, the capsular micro light-emitting device can be effectively manufactured.

The method for manufacturing the capsular micro light-emitting device preferably includes the step of applying the laser beam to the tubular multilayer body formed with the encapsulation layer to re-expose the exposed portions before the tubular multilayer body formed with the encapsulation layer is cut at the exposed portions. Since the necessity to individually remove the encapsulation layer formed on the outer periphery of the exposed portions in order to form electrode portions for electrical connection with a power source after the tubular multilayer body is cut at the exposed portions is obviated by applying the laser beam to re-expose the exposed portions before the tubular multilayer body formed with the encapsulation layer is cut at the exposed portions, it becomes possible to manufacture the capsular micro light-emitting device more effectively.

In the method for manufacturing the capsular micro light-emitting device, the first electrode is a cathode, and the method preferably includes the step of coating an electron injection layer material onto the outer periphery of the linear first electrode material and drying the electron injection layer material and/or the step of coating an electron transport layer material onto the outer periphery of the linear first electrode material and drying the electron transport layer material before the light emitting layer material is coated. In the method for manufacturing the capsular micro light-emitting device, the second electrode is an anode, and the method preferably includes the step of coating a hole transport layer material onto the outer periphery of the linear first electrode material and drying the hole transport layer material and/or the step of coating a hole injection layer material onto the outer periphery of the linear first electrode material and drying the hole injection layer material before the second electrode material is supplied. In the method for manufacturing the capsular micro light-emitting device, the first electrode is an anode, and the method preferably includes the step of coating a hole transport layer material onto the outer periphery of the linear first electrode material and drying the hole transport layer material and/or the step of coating a hole injection layer material onto the outer periphery of the linear first electrode material and drying the hole injection layer material before the light emitting layer material is coated. In the method for manufacturing the capsular micro light-emitting device, the second electrode is a cathode, and the method preferably includes the step of coating an electron injection layer material onto the outer periphery of the linear first electrode material and drying the electron injection layer material and/or the step of coating an electron transport layer material onto the outer periphery of the linear first electrode material and drying the electron transport layer material before the second electrode material is supplied.

Figure 1:
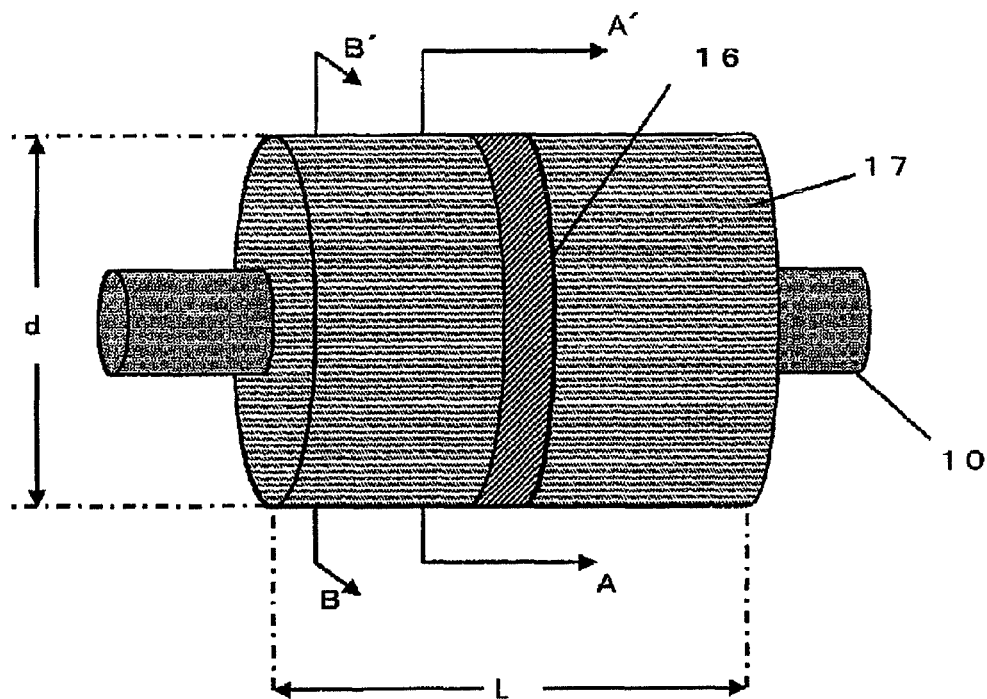
FIG. 1 is a schematic view of a preferred embodiment of a capsular micro light-emitting device.

EXPLANATION OF LETTERS OR NUMERALS 10 cathode terminal (bus electrode)
11 cathode layer
12 electron transport layer
13 light emitting layer
14 hole transport layer
15 anode layer
16 anode terminal (bus electrode)
17 encapsulation layer
20 tubular multilayer body
21 laser beam source
22 exposed portion
L laser beam
A traveling direction

MODE OF CARRYING OUT THE INVENTION

Capsular Micro Light-Emitting Device

A preferred embodiment of a capsular micro light-emitting device will be described in detail with reference to the drawings. Throughout the description and the drawings, the same or equivalent components are designated by the same reference numerals and the repeated description thereof will be omitted.

The capsular micro light-emitting device includes a light emitting part having at least a light emitting layer and constituting one pixel, a capsular encapsulation layer for individually encapsulating the light emitting part, and first and second electrodes for applying a voltage to the light emitting part.

Figure 2:
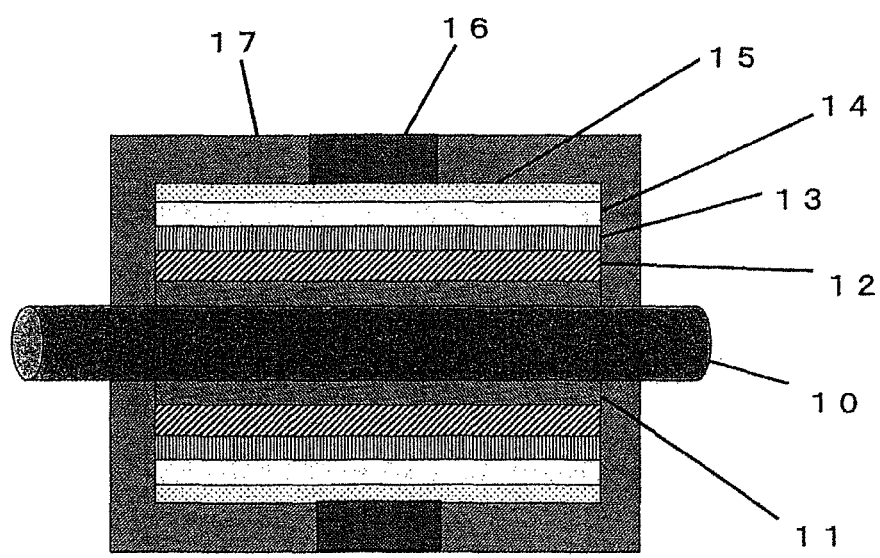
FIG. 2 is a schematic A-A' cross-sectional view of the preferred embodiment of the capsular micro light-emitting device according to the present invention shown in FIG. 1.
Figure 3:
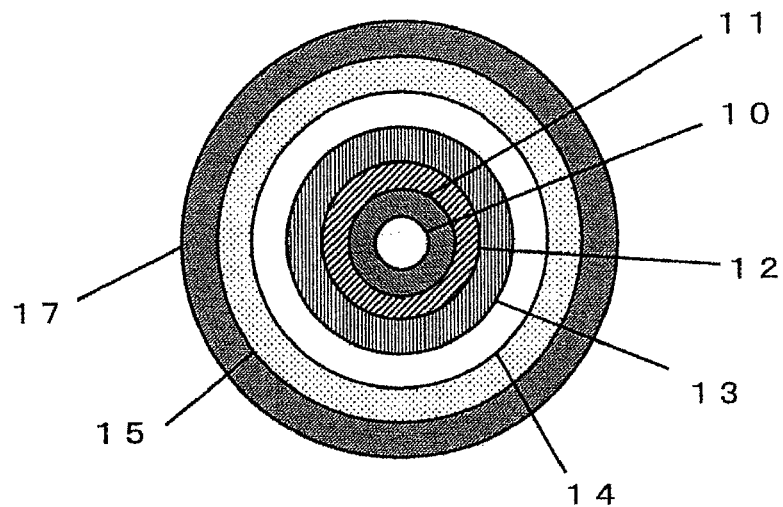
FIG. 3 is a schematic B-B' cross-sectional view of the preferred embodiment of the capsular micro light-emitting device shown in FIG. 1.

A schematic view of the preferred embodiment of the capsular micro light-emitting device is shown in FIG. 1. The capsular micro light-emitting device has a cylindrical capsular configuration. In the present description, the "capsular configuration" means a configuration having a ratio of a length L to a diameter d of a cross section (d:L) falling within a range of 1:1 to 1:5. In FIG. 1, a B-B' cross section is circular. However, when the cross section is not circular, it is assumed that the maximum diameter of the circumcircle of the cross-sectional configuration is the diameter d. The length L is normally not more than 2000 μm, more preferably not more than 1000 μm, and even more preferably not more than 500 μm. FIG. 2 is a schematic A-A' cross-sectional view of the preferred embodiment of the capsular micro light-emitting device shown in FIG. 1, and FIG. 3 is a schematic B-B' cross-sectional view of the preferred embodiment of the capsular micro light-emitting device according to the present invention shown in FIG. 1. The capsular micro light-emitting device shown in FIG. 2 is obtained by using a preferred organic EL material for a light emitting layer, and includes a cathode terminal (bus electrode) 10, a cathode layer 11, an electron transport layer 12 placed on an outer periphery of the cathode layer 11, a light emitting layer 13 placed on an outer periphery of the electron transport layer 12, a hole transport layer 14 placed on an outer periphery of the light emitting layer 13, an anode layer 15 placed on an outer periphery of the hole transport layer 14, an anode terminal (bus electrode) 16, and a capsular encapsulation layer 17 placed in such a manner as to cover these members. In the embodiment shown in FIG. 1, the light emitting part includes the light emitting layer 13, the electron transport layer 12, and the hole transport layer 14.

The cathode terminal 10 electrically connects the capsular micro light-emitting device to an external power source (not shown). As a terminal material for forming the cathode terminal 10, a known material may be appropriately used. For example, a conductive metal such as nickel, aluminum, copper, or the like may be used. It is preferable to use the cathode terminal 10 with a non-planar cross section (e.g., circular cross section, polygonal cross section, or the like), and the one with the circular cross section is used in the present embodiment. The cathode terminal 10 may be hollow (tubular) or solid (cylindrical). The diameter of the cathode terminal 10 is preferably in a range of about 1 to 1000 μm, and more preferably in the range of about 10 to 300 μm. When the diameter is less than the lower limit described above, the workability at the time of the manufacture is lowered. On the other hand, when the diameter exceeds the upper limit described above, variations in the flow of a current and the application of a voltage become large, or heat generation from the device itself becomes large. When the cross section is not circular, a diameter of the circumcircle of the cross-sectional configuration is assumed to be the diameter.

The cathode layer 11 is placed such that an electron is released at a relatively low voltage. When the preferred organic EL material is used for the light emitting layer, as a cathode layer material for forming the cathode layer 11, it is preferable to use a material having a relatively small work function and allowing easy injection of electrons into the light emitting layer. The material may include, e.g., metals such as barium, calcium, gold, magnesium, and an alloy of magnesium and silver, or oxides thereof. Furthermore, the material may also include a material with a multilayer structure obtained by forming a layer composed of aluminum, silver, chromium, or the like on the metals mentioned above. When an inorganic EL material is used for the light emitting layer, the cathode layer material includes, e.g., gold, silver, copper, chromium, and aluminum. A thickness of the cathode layer 14 may be changed as needed in accordance with an intended design. The thickness of the cathode layer 11 is preferably in a range of about 3 to 50 nm. When the thickness of the cathode layer 11 is out of the range described above, the injection of electrons into the light emitting layer is not sufficiently induced.

When the light emitting comprises the preferred organic EL material, the electron transport layer 12, which is placed on the outer periphery of the cathode layer 11, is preferably placed to improve the efficiency of the effect of an electron transport. The electron transport layer 12 may be formed by appropriately using a material having an electron-transport property, and the material therefor includes, e.g., a polycyclic hydrocarbon-based derivative, a heterocyclic compound, and tris (8-quinolinolate) aluminum.

The light emitting layer 13 contains a material which can emit light by applying a voltage (causing a current to flow) thereto from the first and second electrodes. As a light emitting layer material used for the light emitting layer 13, any material may be used as long as the material can emit light by causing a current to flow or applying a voltage thereto. The organic EL material or the inorganic EL material is preferable, and the organic EL material is especially preferable. As the organic EL material, any organic material may be used as long as the organic material can emit light by applying a voltage (causing a current to flow) thereto. The organic EL material includes, e.g., a distyrylbiphenyl-based material, a dimesitylboryl-based material, a stilbene-based material, a dypyrril-dicyano-benzene-based material, a benzoxazole-based material, a distyryl-based material, a carbazole-based material, a dibenzo-chrysene-based material, a arylaminebased material, a pyrene-substituted oligothiophene-based material, a PPV oligomer-based material, and a polyfluorene-based material. As the inorganic EL material, any inorganic material which can emit light by applying a voltage thereto, and the material includes, e.g., GaN obtained by doping Mg, ZnS obtained by doping Mn, and SrS obtained by doping Ce. A thickness of the light emitting layer 13 may be appropriately changed in accordance with an intended design, and is preferably in a range of about 10 to 200 nm. When the thickness is less than the lower limit described above, the recombination of an electron and a hole is not sufficiently induced, sufficient brightness can not be obtained, or the manufacture becomes difficult. On the other hand, when the thickness exceeds the upper limit described above, the voltage to be applied becomes high. The voltage applied to the light emitting layer 13 may be appropriately changed in accordance with the design, and is preferably in a range of about 2 to 100 V in terms of effective light emission.

The hole transport layer 14 is preferably placed to improve the efficiency of the effect of the hole transport when the light emitting layer comprises the preferred organic EL material according to the present invention. A hole transport layer material for forming the hole transport layer 14 includes, e.g., aromatic amine derivatives such as N,N'-diphenyl-N,N'-di(3-methylphenyl) 4,4'-diaminobiphenyl (TPD), NPB (4,4'-bis [N-(1-naphthyl)-N-phenylamino] biphenyl), and the like. A thickness of the hole transport layer 14 may be appropriately changed in accordance with an intended design, and is preferably in a range of about 5 to 100 nm. When the thickness is less than the lower limit described above, the manufacture becomes difficult, or the sufficient effect of the hole transport can not be obtained. On the other hand, when the thickness exceeds the upper limit described above, the voltage to be applied becomes large.

As an anode layer material for forming the anode layer 15, any material capable of forming the anode may be used, and the material therefor includes, e.g., indium tin oxide (ITO), tin oxide, nickel, gold, and the like. A thickness of the anode layer 15 may be appropriately changed in accordance with the intended design, and is preferably in a range of about 5 to 300 nm. When the thickness exceeds the upper limit described above, the voltage to be applied becomes large.

The anode terminal 16 is placed to electrically connect the light emitting device to the external power source (not shown) via the anode terminal 16. As a material for forming the anode terminal 16, the same material as the terminal material described above may be used.

The encapsulation layer 17 is placed to protect the light emitting part including the light emitting layer 13 from outside air or the like. An encapsulant for forming the encapsulation layer 17 includes, e.g., a transparent thermosetting epoxy resin, a photo-setting epoxy resin, a silicon oxide film, and glass. A thickness of the encapsulation layer 17 may be appropriately changed in accordance with an intended design, and is preferably in a range of about 10 to 300 nm. When the thickness is less than the lower limit described above, the encapsulation is not sufficiently performed or sufficient strength of the encapsulation film is not obtained. On the other hand, when the thickness exceeds the upper limit described above, the manufacture becomes difficult or the light emitted does not fully pass therethrough.

Although the preferred embodiment of the capsular micro light-emitting device has been described, the present invention is not limited to the embodiment. For example, in the capsular micro light-emitting device of the embodiment described above, the configuration thereof is cylindrical and the B-B' cross section is circular. However, in the configuration of the capsular micro light-emitting device, the cross section may be oval or polygonal. There may be used the capsular micro light-emitting device having a cylindrical capsular configuration with an average diameter of normally 1 to 1000 µm, more preferably 1 to 500 µm, and even more preferably 10 to 300 µm, a length of 1 to 2000 µm, more preferably 1 to 1000 µm, and even more preferably 1 to 500 µm, and a ratio between the average diameter and the length (average diameter:length) of 1:1 to 1:5. The capsular micro light-emitting device of the embodiment described above has the cathode terminal (bus electrode) 10, the cathode layer 11, the electron transport layer 12, the light emitting layer 13, the hole transport layer 14, the anode layer 15, the anode terminal (bus electrode) 16, and the encapsulation layer 17. However, the capsular micro light-emitting device may appropriately include only the light emitting part having at least the light emitting layer and constituting one pixel, the capsular encapsulation layer for individually encapsulating the light emitting part, and the first and second electrodes for applying a voltage to the light emitting part, and other components are not especially limited.

When the light emitting layer comprises the preferred organic EL material, in the capsular micro light-emitting device, the light emitting part may include, e.g., an electron injection layer placed on the outer periphery of the cathode layer 11 to improve the effect of the electron injection. A injection layer material for forming the electron injection layer includes, e.g., Ba, Ca, CaF, LiF, Li, and NaF. A thickness of the electron injection layer is preferably in a range of about 3 to 50 nm. When the thickness exceeds the upper limit described above, a voltage to be applied becomes large. In the capsular micro light-emitting device, the light emitting part may include a hole injection layer placed so as to be in contact with an inner periphery of the anode layer 15 in order to improve the effect of the hole injection. A hole injection layer material for forming the hole injection layer includes, e.g., a phthalocyanine complex such as copper phthalocyanine or the like, an aromatic amine derivative such as 4, 4', 4"-tris (3-methyphenylphenylamino) triphenylamine or the like, a hydrazone derivative, a carbazole derivative, a triazole derivative, an imidazole derivative, an oxadiazole derivative having an amino group, polythiophene, and the like. A thickness of the hole injection layer is preferably in a range of about to 300 nm. When the thickness exceeds the upper limit described above, a voltage to be applied becomes large.

Method for Manufacturing Capsular Micro Light-Emitting Device

A description will be given to a preferred embodiment of a method for manufacturing a capsular micro light-emitting device. The method for manufacturing the capsular micro light-emitting device includes the steps of, (I) coating a light emitting layer material onto an outer periphery of a linear first electrode material and drying the light emitting layer material to form a tubular light emitting layer, (II) forming a tubular second electrode layer by supplying a second electrode material onto an outer periphery of the tubular light emitting layer to obtain a tubular multilayer body, (III) applying a laser beam onto an outer periphery of the tubular multilayer body for irradiation at prescribed intervals to form exposed portions where the first electrode material is exposed at prescribed intervals, (IV) coating an encapsulant onto the outer periphery of the tubular multilayer body formed with the exposed portions and drying the encapsulant to form an encapsulation layer, and (V) cutting the tubular multilayer body formed with the encapsulation layer at the exposed portions to obtain the capsular micro light-emitting device including a light emitting part having at least a light emitting layer and constituting one pixel, a capsular encapsulation layer for individually encapsulating the light emitting part, and first and second electrodes for applying a voltage to the light emitting part.

A description will be given by taking the method for manufacturing the capsular micro light-emitting device in which the first electrode is a cathode and the second electrode is an anode.

In the step (I), the light emitting layer material is coated onto the outer periphery of the linear first electrode material, and is dried to form the tubular light emitting layer. As the first electrode material, a material made only of a core wire comprising a terminal material, or a material having a tubular cathode layer on the outer periphery of the core wire may be used. However, it is preferable to use the material having the tubular cathode layer on the outer periphery of the core wire. As the terminal material and a cathode layer material for forming the cathode layer, the same materials as the terminal material and the cathode layer material described in the capsular micro light-emitting device mentioned above may be used. As a method for supplying the cathode layer material to the terminal material, for example, an evaporation method such as a vacuum evaporation, a chemical evaporation, or the like, an electroplating, an electroless plating, or an electron bombardment process may appropriately be adopted. A method for coating the light emitting layer material includes a method using, e.g., a dipping, a spray, a coater, a printer, or a brush. When the light emitting layer material is coated, the light emitting layer material may be coated as a liquid mixture obtained by properly mixing the light emitting layer material with a suitable solvent (water, organic solvent, or the like). For a preparation method, concentration, and viscosity of the liquid mixture, a known method may be adopted to appropriately prepare a desired liquid mixture. As a method for drying the light emitting layer material after the light emitting layer material is coated, for example, a method such as air drying, drying by heating, or the like may be adopted. When the material is heat dried by heating, it is preferable to dry the light emitting layer by heating for five minutes to five hours under a temperature condition which is not higher than the glass-transition temperature of the light emitting material, and does not damage the light emitting layer material. When an electron injection layer is placed in the capsular micro light-emitting device, it is preferable to coat an electron injection layer material onto the outer periphery of the linear first electrode material and dry the electron injection layer material before the light emitting layer material is coated. When an electron transport layer is placed in the capsular micro light-emitting device, it is preferable to coat and dry an electron transport layer material before the light emitting layer material is coated. As the electron injection layer material and the electron transport layer material, the same materials as the electron injection layer material and the electron transport layer material described in the capsular micro light-emitting device mentioned above may be used. As methods for coating and drying the electron injection layer material and the electron transport layer material, the same methods as the methods for coating and drying the light emitting layer material described above may be adopted.

In the step (II), the tubular second electrode layer is formed by supplying the second electrode material onto the outer periphery of the tubular light emitting layer to obtain the tubular multilayer body. Since the second electrode is the anode, the second electrode material is an anode layer material for forming an anode layer. As the anode layer material, the same material as the anode layer material described in the capsular micro light-emitting device mentioned above may be used. As a method for supplying the anode layer material, for example, the deposition method such as the vacuum deposition, the chemical deposition, or the like, the electroplating, the electroless plating, the electron bombardment process, or a sol-gel process may appropriately be adopted. When a hole transport layer is placed in the capsular micro light-emitting device, it is preferable to include the step of coating a hole transport layer material onto the outer periphery of the linear first electrode material and drying the hole transport layer material before the second electrode material is supplied. When a hole injection layer is placed in the capsular micro light-emitting device, it is preferable to include the step of coating and drying a hole injection layer material. As the hole transport layer material and the hole injection layer material, the same materials as the electron injection layer material and the electron transport layer material described in the capsular micro light-emitting device mentioned above may be used. As methods for coating and drying the hole transport layer material and the hole injection layer material, the same methods as the methods for coating and drying the light emitting layer material described above may be adopted.

Figure 4:
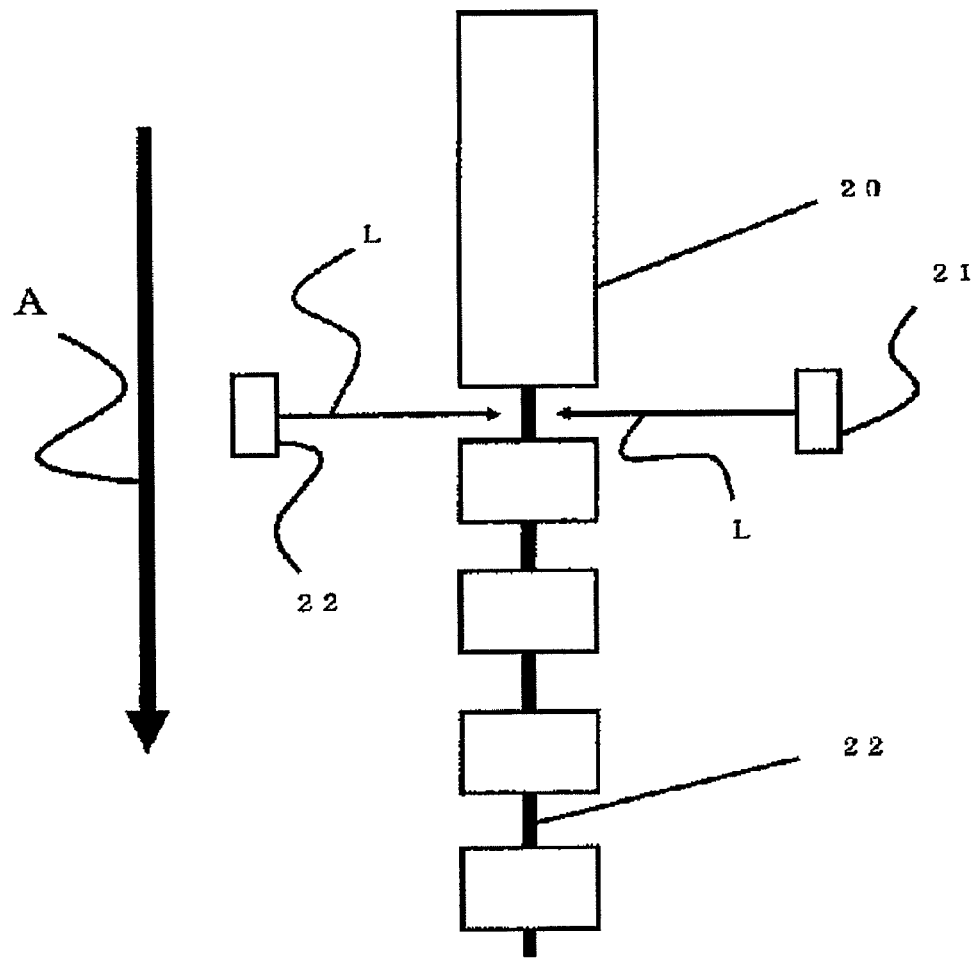
FIG. 4 is a schematic view illustrating a state where a laser beam is applied onto an outer periphery of a tubular multi-layer body for irradiation.

In the step (III), the laser beam is applied onto the outer periphery of the tubular multilayer body for irradiation at prescribed intervals to form the exposed portions where the first electrode material is exposed at prescribed intervals. A description will be given to a preferred example of the step (III) of the irradiation of the laser beam with reference to FIG. 4. FIG. 4 is a schematic view illustrating a state where a laser beam L is applied from a laser beam source 21 onto the outer periphery of the tubular multilayer body 20 for irradiation to form exposed portions 22 where the first electrode material is exposed. In FIG. 4, an arrow A indicates a traveling direction. The laser beam source 21 may be any laser beam source as long as the laser beam source can remove layers other than the first electrode material from the tubular multilayer body 20, and the laser beam source which can apply a high-output pulse laser beam L for irradiation is preferable. As the laser beam L, a pulse laser beam having an irradiation intensity of 5 W/cm$^2$ to 100 W/cm$^2$ is preferable. As the laser beam L, a sheet-like laser beam is preferable in terms of an improvement in production efficiency. When the laser beam L is applied for irradiation, the laser beam L is adjusted such that only layers other than the first electrode material in the tubular multilayer body 20 are removed by the irradiation of the laser beam prior to the irradiation of the laser beam L. The interval of irradiation of the laser beam L may be appropriately adjusted in accordance with the intended design of the capsular micro light-emitting device. By applying the laser beam L onto the outer periphery of the tubular multilayer body 20 for irradiation, the exposed portions 22 where the first electrode material is exposed may be formed. Although the first electrode material is exposed by the irradiation of the laser beam, the core wire comprising the terminal material described above may also be exposed by the irradiation of the laser beam L.

In the step (IV), the encapsulant is coated onto the outer periphery of the tubular multilayer body formed with the exposed portions, and is dried to form the encapsulation layer. As an encapsulant, the same material as the encapsulant described in the capsular micro light-emitting device mentioned above may be used. As methods for coating and drying the encapsulant, the same methods as the methods for coating and drying the light emitting layer material mentioned above may be adopted. As another method for forming the encapsulation layer, a method in which the encapsulant is deposited to form the encapsulation layer may also be adopted.

Figure 5:
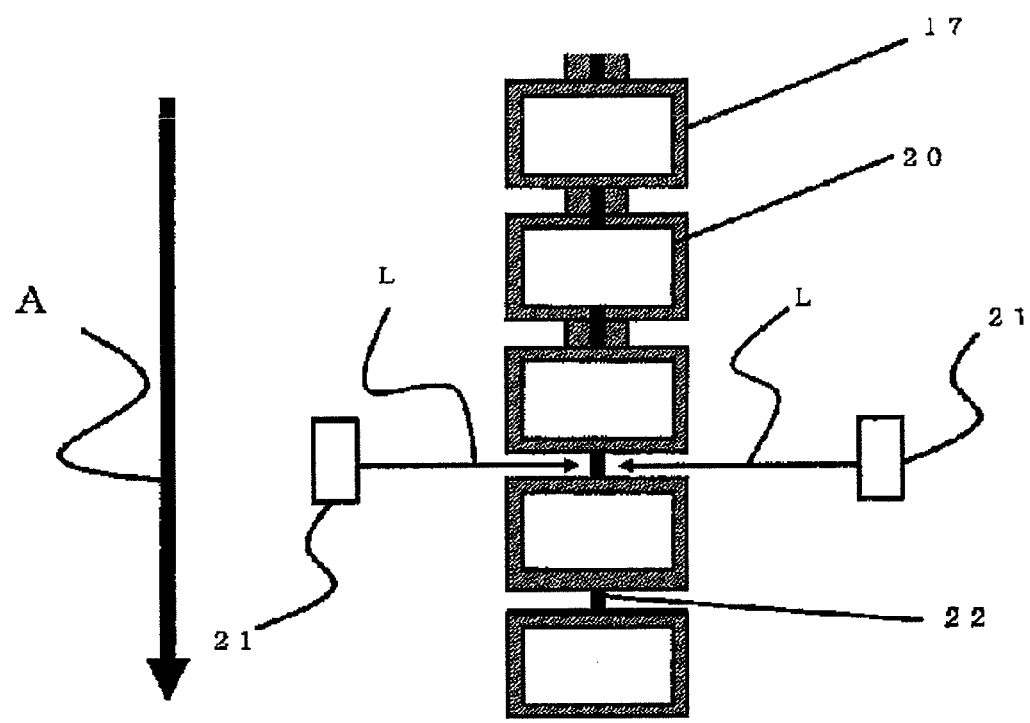
FIG. 5 is a schematic view illustrating a state where the laser beam is applied onto the tubular multilayer body formed with an encapsulation layer for irradiation.

In the step (V), the tubular multilayer body formed with the encapsulation layer is cut at the exposed portions. As a method for cutting the tubular multilayer body at the exposed portions, a cutting method using a high-output laser beam may be adopted. By the cutting, the capsular micro light-emitting device including the light emitting part having at least the light emitting layer and constituting one pixel, the capsular encapsulation layer for individually encapsulating the light emitting part, and the first and second electrodes for applying a voltage to the light emitting part can be attained. In the capsular micro light-emitting device, in order to electrically connect the anode layer to the external power source, the anode terminal may be formed so as to be in contact with the anode layer when in use, or the anode terminal may also be formed in the tubular multilayer body in advance so as to be in contact with the anode layer before the tubular multilayer body formed with the encapsulation layer is cut at the exposed portions. As a method for forming the anode terminal, the deposition method such as the vacuum deposition, the chemical deposition, or the like, the electroplating, the electroless plating, or the electron bombardment process may appropriately be adopted. As a terminal material for forming the anode terminal, the same material as the terminal material described in the capsular micro light-emitting device mentioned above may be used. Before the tubular multilayer body formed with the encapsulation layer is cut at the exposed portions in the step (V), it is preferable to include the step of applying the laser beam to the tubular multilayer body formed with the encapsulation layer to re-expose the exposed portions. A description will be given to a preferred example of the step of applying the laser beam to re-expose the exposed portions with reference to FIG. 5. FIG. 5 is a schematic view illustrating a state where the exposed portion 22 is re-exposed by applying the laser beam L to the tubular multilayer body 20 formed with the encapsulation layer 17. In FIG. 5, the arrow A indicates the traveling direction. By applying the laser beam L to the exposed portion 22 to re-expose the exposed portion 22, the tubular multilayer body where only the first electrode material is exposed and other portions are encapsulated can be attained. Further, by performing the step (V) with respect to the tubular multilayer body, the capsular micro light-emitting device where a part of the first electrode material is exposed can be efficiently obtained. Preferred conditions of the laser beam source 21 for the irradiation of the laser beam L and the laser beam L are the same as those described above.

Although the preferred embodiment of the capsular micro light-emitting device and its manufacturing method has been described thus far, the present invention is not limited to the embodiment described above. In the above-described embodiment, although the first electrode of the capsular micro light-emitting device is the cathode and the second electrode thereof is the anode, the first electrode may be the anode, and the second electrode may be the cathode.

INDUSTRIAL APPLICABILITY

In accordance with the present invention, there is provided a capsular micro light-emitting device which allows the obtention of a sheet-like light emitting apparatus having highly excellent flexibility and capable of individually repairing a faulty pixel with ease at the time of occurrence of faults, and a method for effectively manufacturing the capsular micro light-emitting device.

Since the capsular micro light-emitting device according to the present invention is a light emitting device in which a light emitting part having at least a light emitting layer and constituting one pixel is individually encapsulated, it is especially useful as a material to be used at the time of manufacturing flat and three-dimensional flexible luminous bodies, and can be preferably used for, e.g., a wall-hanging display or the like.

The invention claimed is:

1. A capsular micro light-emitting device which is a pixel of light emitting apparatus, comprising:
    a light emitting part having at least a light emitting layer and constituting one pixel;
    a capsular encapsulation layer for individually encapsulating the light emitting part; and
    first and second electrodes for applying a voltage to the light emitting part; and
    wherein the capsular light-emitting device has a cylindrical capsular configuration with an average diameter of 1 to 1000 μm, a length of 1 to 2000 μm, and a ratio between the average diameter and the length (average diameter: length) of 1:1 to 1:5.

2. The device of claim 1, wherein the light emitting layer is a tubular light emitting layer, the first electrode is placed in an inner periphery of the tubular light emitting layer, and the second electrode is placed on an outer periphery of the tubular light emitting layer.

3. The device of claim 1, wherein the light emitting layer comprises an organic EL material or an inorganic EL material.

4. The device of claim 1, wherein one of the first electrode and the second electrode is a cathode, and the light emitting part has at least one layer selected from the group consisting of an electron transport layer and an electron injection layer placed between the cathode and the light emitting layer.

5. The device of claim 1, wherein one of the first electrode and the second electrode is an anode, and the light emitting part has a hole transport layer and/or a hole injection layer placed between the anode and the light emitting layer.

6. A method for manufacturing a capsular micro light-emitting device, comprising the steps of:
    coating a light emitting layer material onto an outer periphery of a linear first electrode material and drying the light emitting layer material to form a tubular light emitting layer;
    forming a tubular second electrode layer by supplying a second electrode material onto an outer periphery of the tubular light emitting layer to obtain a tubular multilayer body;
    applying a laser beam onto an outer periphery of the tubular multilayer body for irradiation at prescribed intervals to form exposed portions where the first electrode material is exposed at prescribed intervals;
    coating an encapsulant onto the outer periphery of the tubular multilayer body formed with the exposed portions and drying the encapsulant to form an encapsulation layer; and
    cutting the tubular multilayer body formed with the encapsulation layer at the exposed portions to obtain the capsular micro light-emitting device comprising a light emitting part having at least a light emitting layer and constituting one pixel, a capsular encapsulation layer for individually encapsulating the light emitting part, and first and second electrodes for applying a voltage to the light emitting layer.

7. The method of claim 6, further comprising the step of applying the laser beam to the tubular multilayer body formed with the encapsulation layer for irradiation to re-expose the exposed portion before the tubular multilayer body formed with the encapsulation layer is cut at the exposed portions.

8. The method of claim 6, wherein the first electrode is a cathode, the method further comprising the step of coating an electron injection layer material onto the outer periphery of the linear first electrode material and drying the electron injection layer material and/or the step of coating an electron transport layer material onto the outer periphery of the linear first electrode material and drying the electron transport layer material before the light emitting layer material is coated.

9. The method of claim 6, wherein the second electrode is an anode, the method further comprising the step of:

coating a hole transport layer material onto the outer periphery of the linear first electrode material and drying the hole transport layer material and/or the step of coating a hole injection layer material onto the outer periphery of the linear first electrode material and drying the hole injection layer material before the second electrode material is supplied.

10. The method of claim 6, wherein the first electrode is an anode, the method further comprising the step of:

coating a hole transport layer material onto the outer periphery of the linear first electrode material and drying the hole transport layer material and/or the step of coating a hole injection layer material onto the outer periphery of the linear first electrode material and drying the hole injection layer material before the light emitting layer material is coated.

11. The method of claim 6, wherein the second electrode is a cathode, the method further comprising the step of:

coating an election injection layer material onto the outer periphery of the linear first electrode material and drying the electron injection layer material and/or the step of coating an electron transport layer material onto the outer periphery of the linear first electrode material and drying the electron transport layer material before the second electrode material is supplied.

\* \* \* \* \*